(12) United States Patent
Welle et al.

(10) Patent No.: US 11,067,428 B2
(45) Date of Patent: Jul. 20, 2021

(54) RADAR FILL LEVEL MEASUREMENT DEVICE COMPRISING A HIGH-FREQUENCY AMPLIFIER

(71) Applicant: VEGA Grieshaber KG, Wolfach (DE)

(72) Inventors: Roland Welle, Hausach (DE); Steffen Waelde, Niedereschach (DE)

(73) Assignee: VEGA Grieshaber KG, Wolfach (DE)

( * ) Notice: Subject to any disclaimer, the term of this patent is extended or adjusted under 35 U.S.C. 154(b) by 335 days.

(21) Appl. No.: 16/137,202

(22) Filed: Sep. 20, 2018

(65) Prior Publication Data
US 2019/0107424 A1 Apr. 11, 2019

(30) Foreign Application Priority Data

Oct. 6, 2017 (EP) .................................... 17195231

(51) Int. Cl.
*G01F 23/284* (2006.01)
*G01S 7/03* (2006.01)
*H01P 5/08* (2006.01)
*H03F 3/195* (2006.01)
*G01S 7/35* (2006.01)
*H01Q 1/22* (2006.01)
(Continued)

(52) U.S. Cl.
CPC .............. *G01F 23/284* (2013.01); *G01S 7/03* (2013.01); *G01S 7/032* (2013.01); *G01S 7/352* (2013.01); *G01S 13/42* (2013.01); *G01S 13/88* (2013.01); *H01P 5/08* (2013.01); *H01Q 1/225* (2013.01); *H03F 3/195* (2013.01); *G01F 22/00* (2013.01); *H03F 2200/294* (2013.01)

(58) Field of Classification Search
None
See application file for complete search history.

(56) References Cited

U.S. PATENT DOCUMENTS 9,910,133 B2   3/2018 Li et al.
2004/0056667 A1   3/2004 Lutke et al.
(Continued)

FOREIGN PATENT DOCUMENTS

DE          100 51 297 A1    4/2002
DE    10 2016 101 318 A1    8/2016
(Continued)

OTHER PUBLICATIONS

European Notice of Allowance dated Feb. 26, 2020 in European Patent Application No. 17195231.0, 46 pages.

*Primary Examiner* — Whitney Moore
(74) *Attorney, Agent, or Firm* — Oblon, McClelland, Maier & Neustadt, L.L.P.

(57) ABSTRACT

A radar fill level measurement device for fill level measurement or for detecting a topology of a filling material surface in a container is provided, including: a first radar chip and a second radar chip, the first radar chip including a first synchronization circuit configured to generate a high-frequency signal, and the second radar chip including a second synchronization circuit; a high-frequency line arrangement configured to transfer the high-frequency signal from the first synchronization circuit to the second synchronization circuit for synchronizing the two radar chips; and a high-frequency amplifier arranged in the high-frequency line arrangement and configured to amplify the high-frequency signal.

12 Claims, 16 Drawing Sheets

(51) Int. Cl.
*G01S 13/42* (2006.01)
*G01S 13/88* (2006.01)
*G01F 22/00* (2006.01)

(56) References Cited

U.S. PATENT DOCUMENTS

| | | |
|---|---|---|
| 2011/0098970 A1 | 4/2011 | Hug et al. |
| 2015/0007653 A1 | 1/2015 | Fehrenbach et al. |
| 2015/0338261 A1* | 11/2015 | Mueller .................. G01S 13/34 342/124 |
| 2017/0141453 A1 | 5/2017 | Waelde et al. |

FOREIGN PATENT DOCUMENTS

| | | |
|---|---|---|
| DE | 10 2015 219 282 A1 | 4/2017 |
| EP | 2 824 431 A1 | 1/2015 |
| EP | 3 171 138 A1 | 5/2017 |
| WO | WO 2014/135452 A1 | 9/2014 |
| WO | WO 2016/011407 A1 | 1/2016 |
| WO | WO 2016/202394 A1 | 12/2016 |

\* cited by examiner

RADAR FILL LEVEL MEASUREMENT DEVICE COMPRISING A HIGH-FREQUENCY AMPLIFIER

CROSS-REFERENCE TO RELATED APPLICATIONS

This application claims the benefit of the filing date of European Patent Application No. 17 195 231.0, filed on 6 Oct. 2017, the entire content of which is incorporated herein by reference.

FIELD

The invention relates to fill level measurement and to the detection of the topology of a filling material surface in a container. The invention relates in particular to a radar fill level measurement device for fill level measurement or for detecting the topology of a filling material surface in a container.

BACKGROUND

Nowadays, fill level measurement using radar fill level measurement devices is known. In contrast to many other fields, the breakthrough for radar technology in fill level measurement was possible only once extremely small reflection signals from the electronics of the measurement devices could be detected and processed.

Modern fill level measurement devices and topology measurement devices that are capable of detecting the precise shape of the surface of a filling material are distinguished not only by a high transmission frequency, which is typically in the gigahertz range, for example in the range of from 75 GHz to 85 GHz, but are instead also capable of reliably processing differences in amplitude of the reflected signal in a range up to 100 dB.

In order to generate and process the high-frequency transmission signals in the range of 79 GHz, a monolithic microwave integrated circuit (MMIC) may be provided. This component may comprise a plurality of transmission and reception channels which are also referred to as radar channels in this application, such that the filling material surface can be scanned.

The more precisely the filling material surface is to be scanned, the more transmission and reception channels are required in order to achieve a high-quality representation, which is associated with a correspondingly high hardware outlay and energy demand.

SUMMARY

The described embodiments, as claimed, provide a radar fill level measurement device for measuring a fill level of a medium or the topology of a medium in a container.

This is achieved by the subject matter of the independent claims. Additional features are recited in the dependent claims and disclosed by the following description.

A described embodiment relates to a radar fill level measurement device that is designed for measuring a fill level of a medium in a container and/or for detecting the topology of a filling material surface in the container. The radar fill level measurement device comprises a first radar chip and a second radar chip. Both the first radar chip and the second radar chip comprise one or more transmission channels for emitting one transmission signal in each case towards the tilting material surface, and one or more reception channels for receiving the transmission signals reflected at the filling material surface. One or more of the transmission channels may also be designed as a combined transceiver channel.

The radar chips may in particular be monolithic microwave integrated circuits which can also be referred to as a radar system-on-chip. A radar system-on-chip (RSoC) of this kind is a highly integrated monolithic microwave integrated circuit (MMIC) that comprises circuit components tor digital functions and which, according to one embodiment, is capable of integrating the entire functionality of a conventional radar system for signal generation, signal processing, and transferring the reception signal, i.e., the reflected transmission signal, into a digital representation, on just one radar chip.

Each of the transmission channels may be designed to generate a high-frequency transmission signal having a frequency in the gigahertz range, for example in the range of from 75 GHz to 85 GHz or above.

The first radar chip comprises a first synchronization circuit which is designed to generate a high-frequency signal, which is generally a local oscillator signal of the radar chip. The high-frequency signal may for example be a frequency-divided signal which thus has a lower frequency than the transmission signal emitted by the radar fill level measurement device. Said local oscillator signal forms a master signal for all the radar chips. The local oscillator signal has a frequency of 40 GHz or 20 GHz, for example.

The second radar chip comprises a second synchronization circuit that is used in a slave function. Furthermore, a high-frequency line arrangement is provided which is designed to transfer the high-frequency signal from the first synchronization circuit to the second synchronization circuit and which is intended for precise synchronization of the two radar chips. The frequency division of the high-frequency signal makes it possible to simplify the path of the conductive track since the power loss reduces. It is also possible for the high-frequency signal to be multiplied again before being used to synchronize the two radar chips, for example by means of a frequency multiplier arranged in the second synchronization circuit.

Furthermore, a high-frequency amplifier (or a plurality thereof) is provided, which is arranged in the high-frequency line arrangement and is designed for amplifying the high-frequency signal.

The first radar chip can therefore be referred to as the master chip which generates a synchronization signal by means of which the second chip, which can be referred to as the slave chip, is synchronized.

According to a further embodiment, the high-frequency signal is a high-frequency signal that is divided by a whole number factor compared to the transmission signal, as already mentioned above.

It is possible for the amplifier output of the high-frequency amplifiers) arranged in the high-frequency line arrangement to be adjusted depending on the fill level and/or for example depending on how many radar chips are currently being used for the fill level measurement.

According to a further embodiment, the high-frequency amplifier has an operating frequency of 20 GHz or, for example, of 40 GHz.

According to a further embodiment, an analogue-to-digital convener is in each case integrated on the first and/or the second radar chip, which converter is designed to convert the reception signal into a digitalized intermediate frequency signal that can be traced back to one or more transmission signals reflected on the filling material surface.

According to a further embodiment, at least two of the transmission channels each comprise an antenna that is connected thereto.

According to a further embodiment, the radar fill level measurement device is designed as a frequency modulated continuous wave (FMCW) radar fill level measurement device that uses a frequency-modulated continuous wave signal for the purpose of measurement, each measurement cycle comprising a frequency sweep that for example has a starting frequency of 75 GHz and a maximum frequency of 85 GHz.

According to a further embodiment, the first and the second radar chips are each based on BiCMOS technology. According to a further embodiment, the radar chips are based on silicon-germanium (SiGe) technology. According to a further embodiment, the radar chips are based on HF CMOS technology and thus comprise high-frequency circuit parts for frequencies of 75 GHz and above.

According to a further embodiment, the fill level measurement device is designed to detect the topology of a medium in a container, i.e., is capable of scanning the filling material surface by means of digital beam shaping.

According to a further embodiment, the high-frequency line arrangement is split by means of a high-frequency power divider in order to allow for precise synchronization. The high-frequency amplifier may be arranged downstream of the high-frequency power divider.

A plurality of high-frequency amplifiers may also be provided, one or more thereof being arranged upstream of a power divider and others in each case being arranged downstream of a power divider.

According to a further embodiment, the high-frequency amplifier is a low noise amplifier (LNA) comprising a separate power supply.

According to a further embodiment, the radar fill level measurement device comprises a signal processor that is designed to switch off the low noise amplifier during a transmission pause of the radar fill level measurement device, during which pause the signal processing and the calculation of the fill level or of the topology of the surface of the medium in the container is carried out by means of the signal processor. Energy can thus be saved. The tasks of the signal processor could also be undertaken by the processor system that is integrated in the field programmable gate array (FPGA).

According to a further embodiment, it is ensured that each high-frequency amplifier is operated exclusively in the linear range thereof. A plurality of high-frequency amplifiers may optionally be provided for this purpose in the high-frequency line arrangement.

According to a further embodiment, the high-frequency line arrangement comprises a first conductive track on a circuit board, a second conductive track on the circuit board, and a waveguide that is arranged therebetween and that transfers the high-frequency signal from the first conductive track to the second conductive track. This can reduce the signal attenuation.

BRIEF DESCRIPTION OF THE DRAWINGS

In the following, embodiments are described in detail with reference to the accompanying drawings. In the following drawings, like reference signs denote like or similar elements. The views in the drawings are schematic and not to scale.

DETAILED DESCRIPTION OF EMBODIMENTS

An advantage of the described multi-channel radar chips is that beam forming can be carried out. The term radar chip can be understood to mean a highly integrated radar chip that comprises a plurality of transmission and reception channels. In this connection, reference can also be made to a radar system-on-chip (RSoC).

RSoCs of this kind are used in fill level measurement. A fill level measurement device that detects the topology of a filling material surface can be provided, which device scans the surface of bulk materials in order to thereby obtain more information regarding the current fill level and the volume thereof, as would be obtained in conventional fill level measurement.

Only small beam widths are required for this, even at large distances, and this is associated with a large antenna aperture.

Figure 1A:
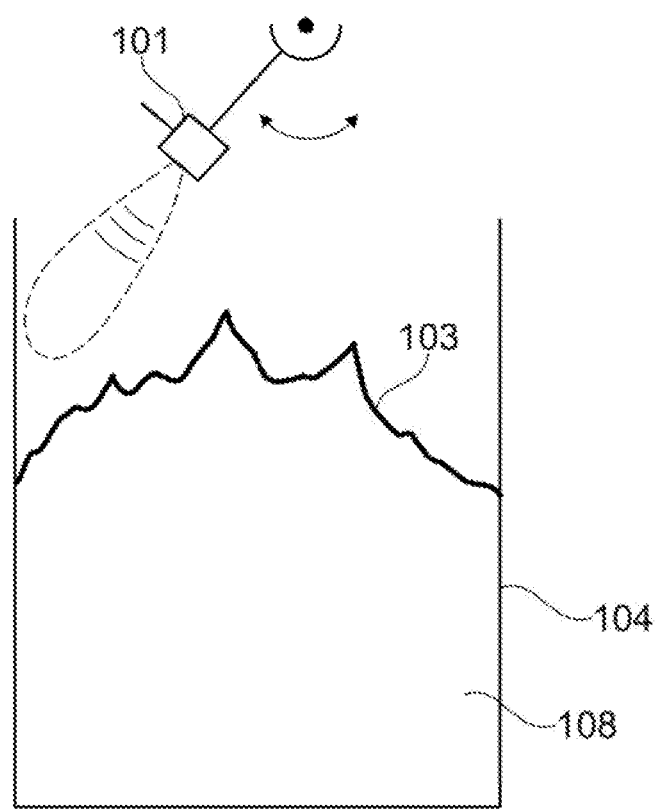
FIG. 1A shows a radar fill level measurement device, installed in a container, for detecting the topology of the surface of a filling material in the container.
Figure 1B:
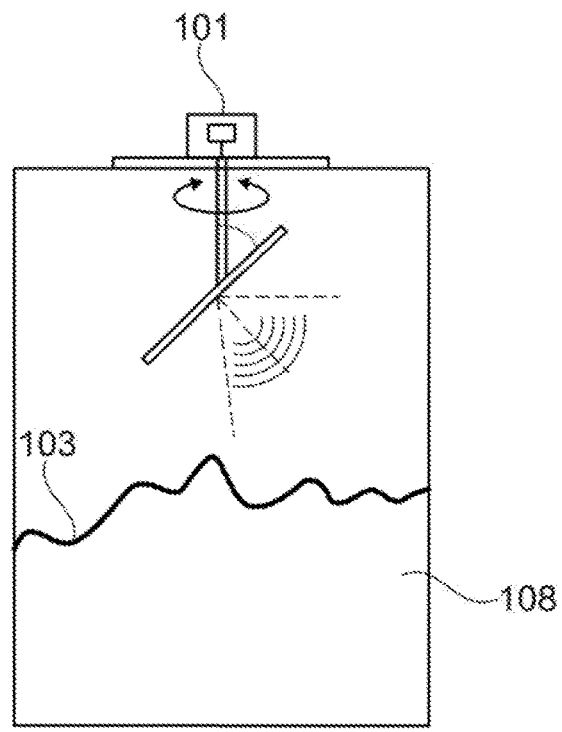
FIG. 1B shows a further radar fill level measurement device.

One option for achieving this is to mechanically pivot a single-channel radar device 101 (FIG. 1A) in order to thus scan the surface 103 of a filling material 108 in a container 104. Partially mechanical systems (FIG. 1B) are another option. In this case, a combination of analogue or digital beam forming is combined with mechanical pivoting.

Figure 1C:
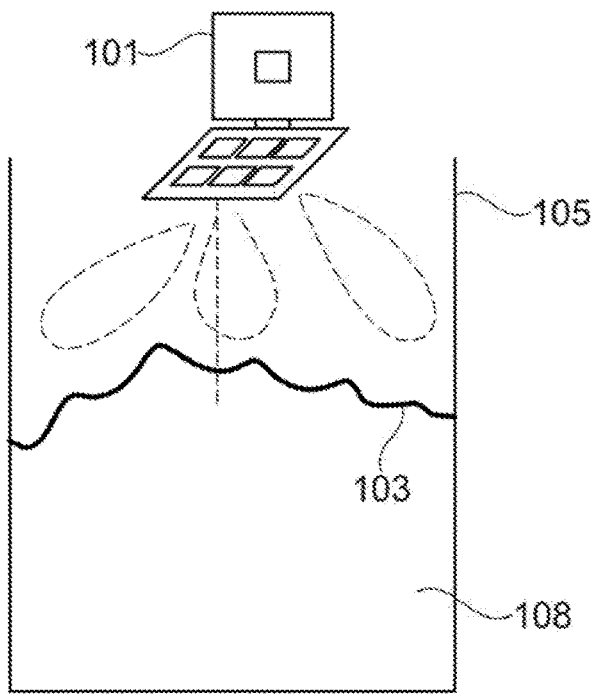
FIG. 1C shows a further radar fill level measurement device.

These systems are disadvantageous in terms of robustness. Mechanical components require frequent maintenance in harsh process conditions and are expensive to produce. It is therefore possible to carry out completely electronic beam forming (FIG. 1C).

Figure 2:
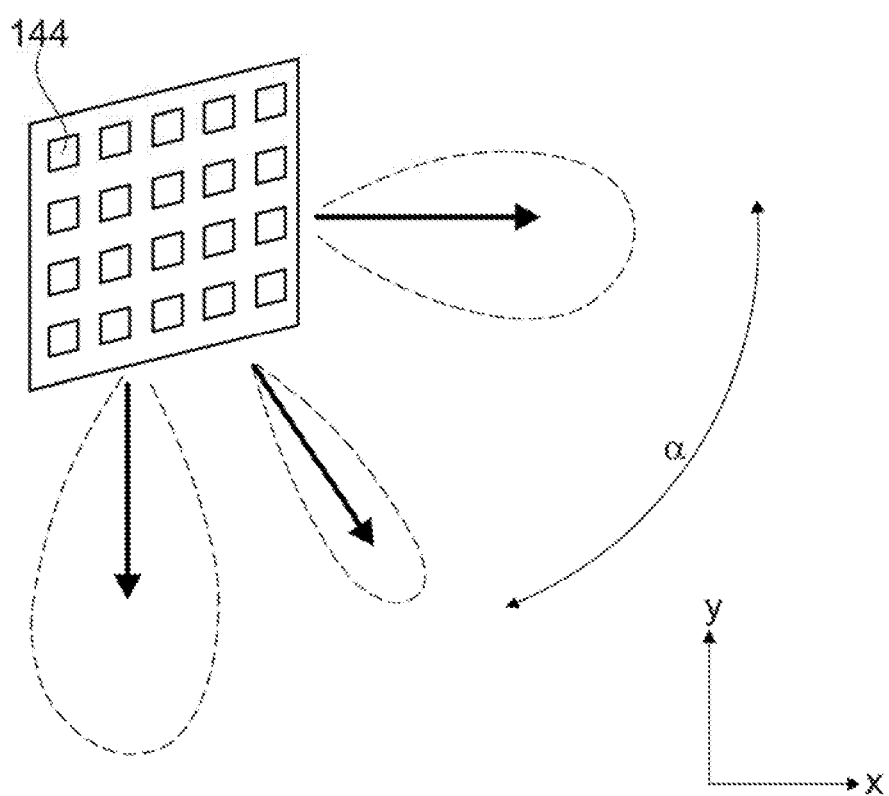
FIG. 2 shows an array antenna of a radar fill level measurement device.
Figure 3:
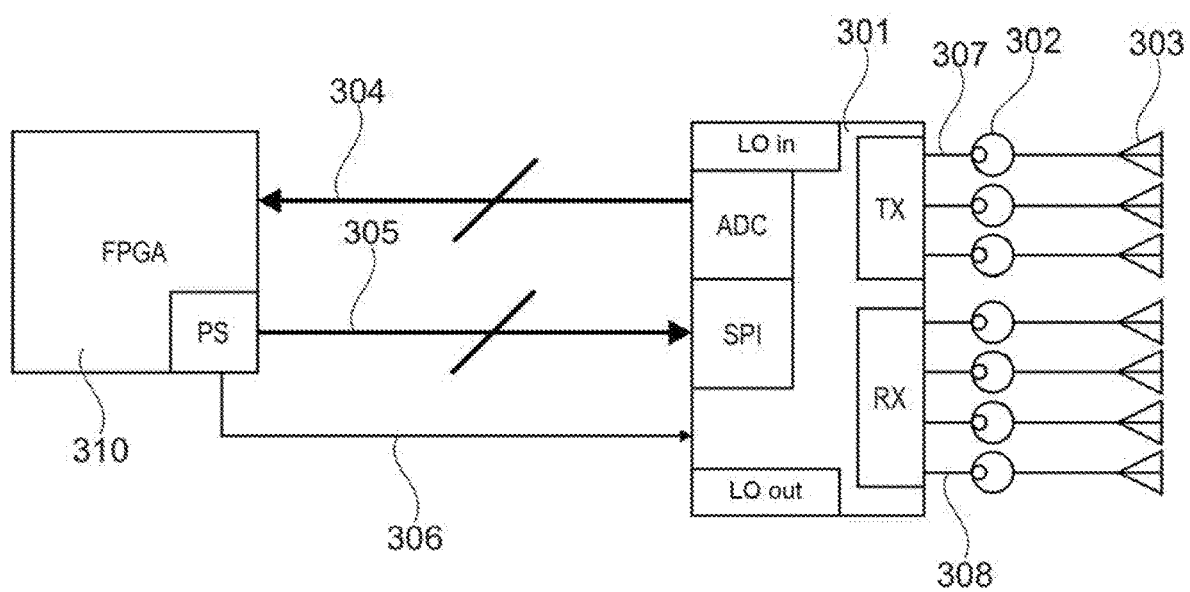
FIG. 3 shows the structure of a radar fill level measurement device comprising a rat chip.
Figure 4A:
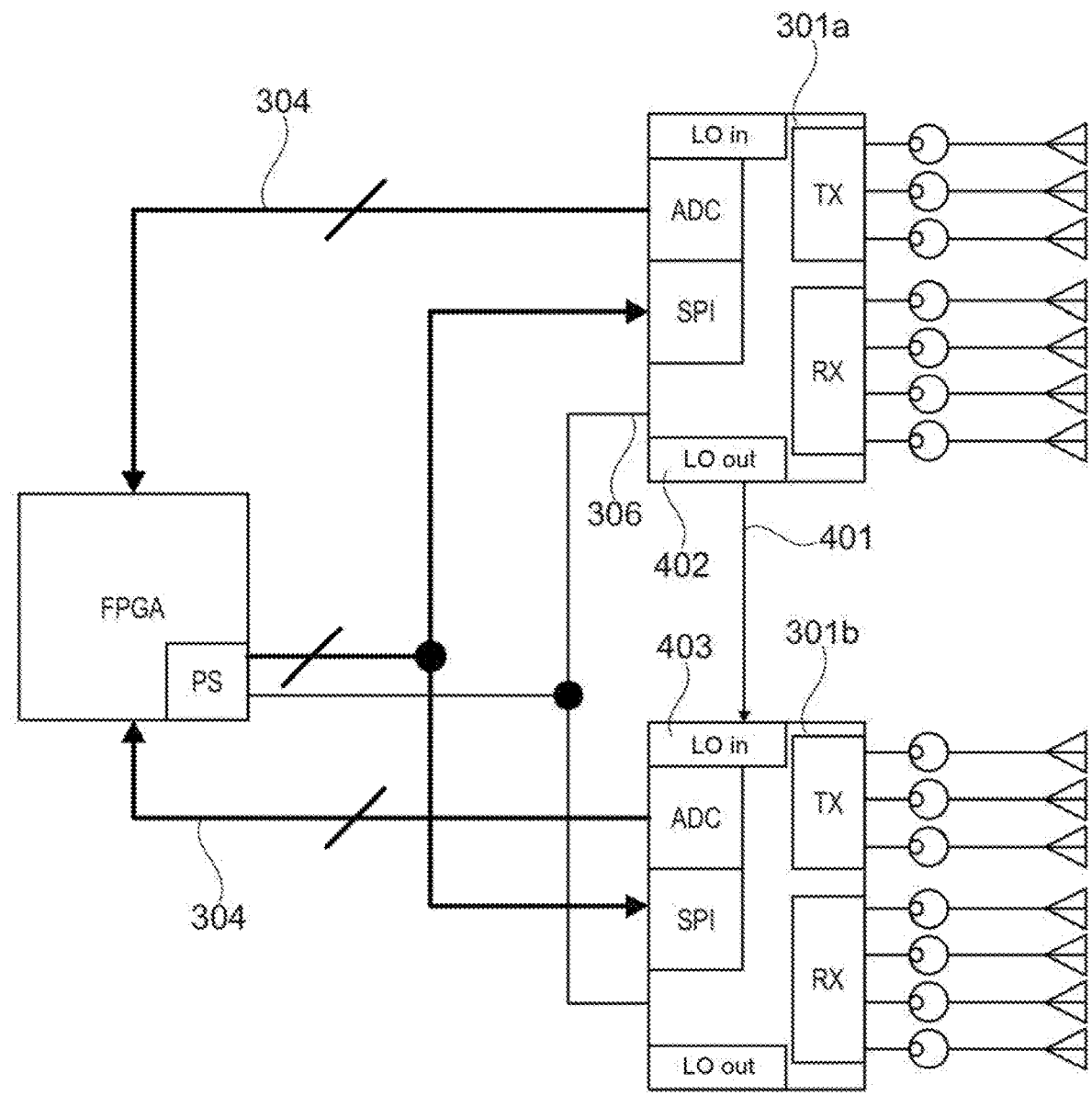
FIG. 4A shows the structure of a further radar fill level measurement device comprising two radar chips.
Figure 4B:
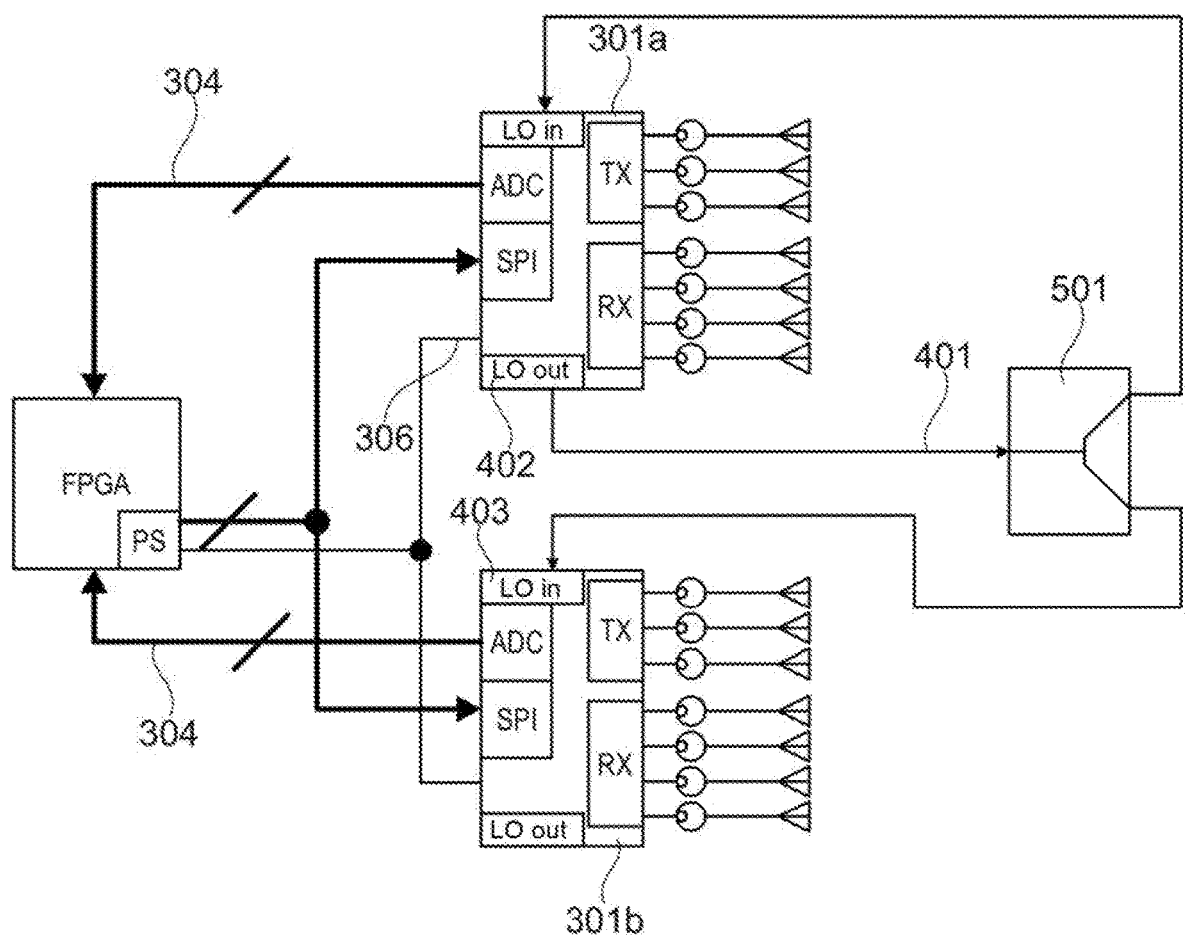
FIG. 4B shows the structure of a further radar fill level measurement device.

In order to achieve similarly large antenna apertures using these beam-forming radar systems, a large number of transmitters and receivers should be provided. The disadvantage of the completely electronic beam forming is that a large number of antennae having relatively small individual apertures must be used. Moreover the transmitters and receivers, which are usually each provided with one antenna element 144, 303, have to be lined up in two dimensions (x- and y-direction) (FIG. 2, FIG. 3).

The topology-detecting fill level measurement technology therefore usually requires more transmitters and receivers than the above applications, resulting in a number of chips that is greater than four.

Radar fill level measurement devices that detect the topology of a filling material surface usually comprise a plurality of transmission and reception antennae. These systems are also referred to as MIMO systems (multiple input multiple output). Directional characteristics of the transmission and reception array antennae can be digitally influenced both on the transmission side and on the reception side by means of corresponding methods of digital beam forming, with the result that a filling material surface can be scanned.

Up to now, said fill level measurement devices use a plurality of discrete high-frequency components, such as mixers, low noise amplifiers, couplers, frequency multipliers, voltage controlled oscillators, etc., and discrete analogue/digital conveners, phase-locked loops, voltage regulators, fillers, amplifiers and further low-frequency components, for each transmission and reception channel. This property makes MIMO systems complex, large, and expensive.

Highly integrated radar chips (cf. FIG. 3) comprise many of said above-mentioned components already fully integrated on a chip 301. The following are already integrated: PLL, VCO, mixers, ADCs, filters, control units, SPI interface, amplifiers, switches, voltage regulators. As a result, a large amount of space can be saved on a circuit hoard. These chips 301 are also advantageous in terms of cost, since they are more cost-effective than a discrete structure comprising a plurality of different individual components.

The radar chips 301 comprise, for example, three transmission stages and four reception stages 307, 308 that each comprise one antenna 303. A possible transmission frequency range may for example be between 55 GHz and 65 GHz or between 75 GHz and 85 GHz.

The radar chips 301 can be parameterized by means of a digital interface (comprising an associated bus 305 (SPI, I²C, etc.). Various parameters can be set or read out in order to adjust the type of modulation, bandwidth, frequency range, sampling frequency, IF Filter characteristics (intermediate frequency signal) etc. The analogue IF signals, which contain information regarding the spacings and angles of objects from the monitoring region, are also digitalized again on the radar chip 301 for the purpose of the subsequent signal processing.

The radar method according to which said radar chips 301 usually operate is a particular FMCW method. However, in the event of a measurement, it is necessary to modulate not only one frequency ramp, but rather a plurality of said ramps in succession, which ramps are in a fixed temporal relationship with one another. A possible number of ramps per measurement is 128 for example. Said 128 ramps combined are referred to as a frame.

Expedient signal processing algorithms make it possible to also determine speeds of a plurality of objects, in addition to spacings. The ramp time is very short compared with the conventional FMCW method, and is generally in the range of between 10 us and 500 µs per ramp. Since the HF bandwidth of the transmission signal may be in the range of between several hundred megahertz and four (or more) gigahertz, the intermediate frequency signal must be digitalized at a higher sampling rate.

The combination of a high HF bandwidth and short ramp times results in a high sampling rate during the analogue-digital conversion.

The interface for die digitalized output signals is usually a high-speed serial, differential digital interface 304 such as LVDS or CSI2. In the example of a radar chip 301 comprising four reception channels, the digital interface of the radar chip 301 comprises four LVDS or CSI2 interfaces, via which the digitalized intermediate frequency signal is transferred. In addition, said digital interfaces use an additional differential clock signal which is required at the receiver of the digitalized data in order to synchronize the interfaces. Depending on the interface, further signal lines are required in order to mark the start and or end of the data packet.

In the event of the radar chip 301 nonetheless stilt providing too few transmission and reception channels for the desired application, said chips 301 provide the possibility of cascading. This means that a plurality of chips are combined to form a synchronized radar unit. This makes it possible to allow the transmitters to simultaneously transmit using a synchronous signal and/or to allow the receivers to receive synchronously, although said transmitters and receivers are located physically on different RSoCs. However, these embodiments require precise synchronization of all transmitters and/or receivers. Precise synchronization means in particular that all the transmitters and/or receivers must oscillate even in a phase-synchronous manner, and that only very small deviations can be tolerated here. Since radar chips facilitate very high frequencies, the paths that the high-frequency signal takes between the transmitting master chip and the receiving slave chip must also be the same to a high degree of precision, i.e., must in particular be of the same lengths and have the same attenuation properties.

This is possible by, in addition to different clock synchronization lines, also distributing a high-frequency signal to a high-frequency line 401 proceeding from one chip, the master chip, to other chips, the slave chips. The high-frequency signal is referred to as the local oscillator signal (LO signal) and, in terms of the frequency range, is a signal that is divided by a whole number factor with respect to the transmission frequency range. The dividing factors two or four are possible, but also other whole number dividing factors. If the radar chip has a transmission frequency of approximately 80 GHz for example, the LO signal may have a frequency of approximately 20 GHz or 40 GHz.

The radar chip that provides the high-frequency signal is referred to as the master 301a. The chips that receive the high-frequency signal are referred to as slaves 301b.

For example, a cascaded radar system containing four radar chips (FIG. 5) that in turn each comprise four reception channels has sixteen digital interfaces via which the associated intermediate frequency signals (measurement data) are transferred.

In order to process said digital measurement data, specific radar chips usually use specially adapted signal processors which, however, have a greatly limited number of digital interfaces. Sometimes units for digital signal processing are integrated on the radar chip itself, but this is useful only to a limited extent, or cannot be used at all, for cascading radar chips and in the context of radar-based, topology-determining fill level measurement.

Therefore, in order to overcome this problem, it has been proposed to use an FPGA component (field programmable gate array 310) in place of the specially adapted signal processor (FIGS. 3, 4A, 4B, and 5). These components, which can be used universally, are available in various embodiments from a few manufacturers. The FPGA receives the digitalized values of the intermediate frequency signal and assumes calculation operations such as averaging, windowing or calculating FFTs (fast Fourier transformation).

An advantage of the combination of radar chips and FPGA is a flexible combination of eight or more radar chips, which would no longer be possible in the case of a specially adapted signal processor as is used in the automobile industry. Cascading such a large number of radar chips makes this technology of interest for fill level measurement technology.

If a much larger number of radar chips is required, it is possible to also use a plurality of FPGAs and to then likewise mutually synchronize said FPGAs.

The FPGA advantageously contains, in addition to the programmable logic cells, an integrated processor system (PS) that can take on control tasks such as parameterization of the radar chip, energy management, control of a display, or communication with a computer or a process control point via a network. The processor system can also signal the start of a measurement via a digital line 306.

Furthermore, the processor system can take on signal processing tasks, as are known in other till level radar measurement devices, such as echo retrieval, interfering echo fade-out, etc.

Depending on the type of radar chip and FPGA, it may be necessary to carry out level adjustment of the digital interfaces. A specially adapted resistor network or an adjustment chip can be used for this purpose.

A further embodiment which can advantageously be implemented comprises using one or more amplifiers comprising an integrated splitter for low-frequency signals which, proceeding from the master, signal the start of a measurement. The master emits said signal and distributes it to all the slaves. In this case, it is important for the lines to be approximately the same length, in order that there are no time offsets in the individual radar chips.

Figure 11:
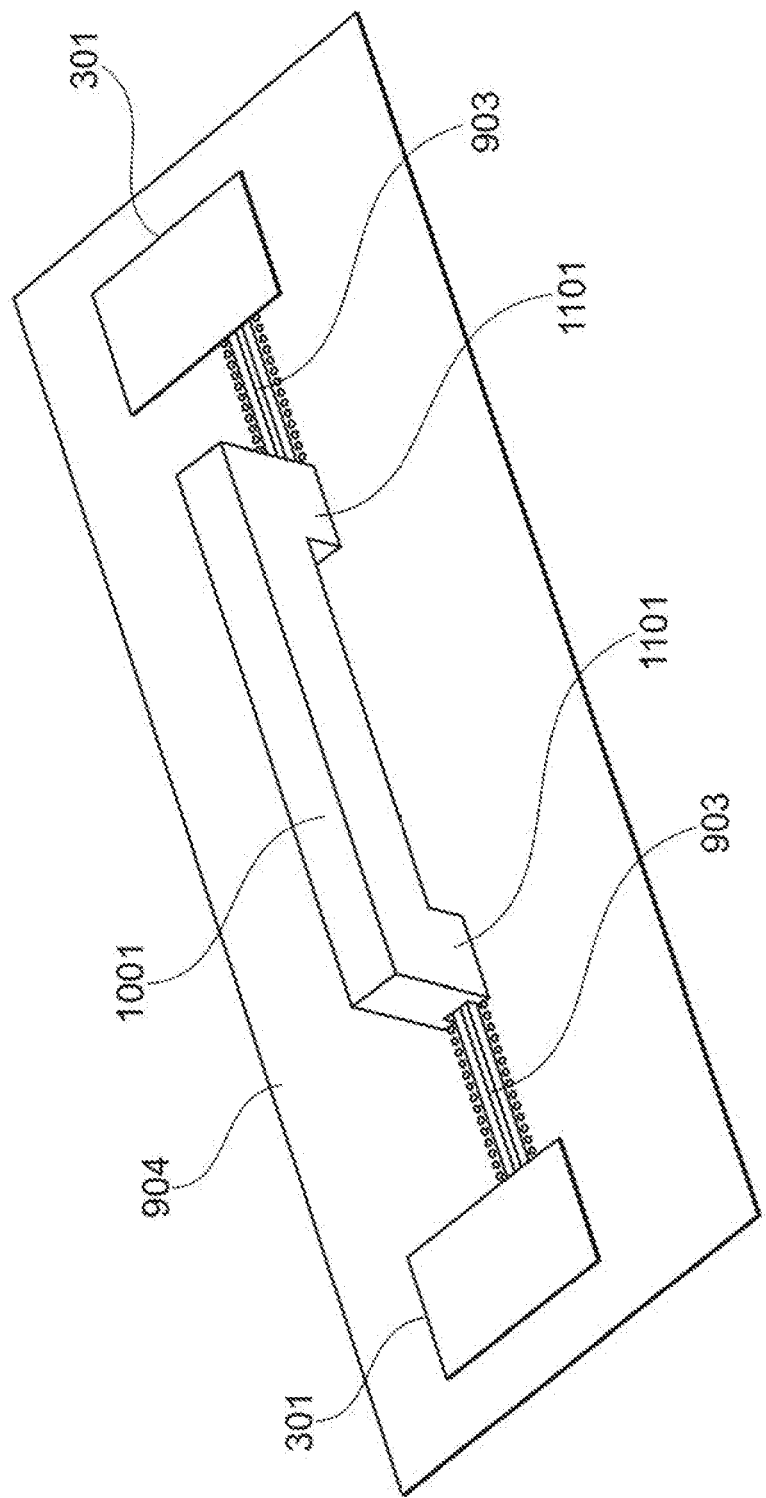
FIG. 11 shows a further high-frequency line arrangement.
Figure 12:
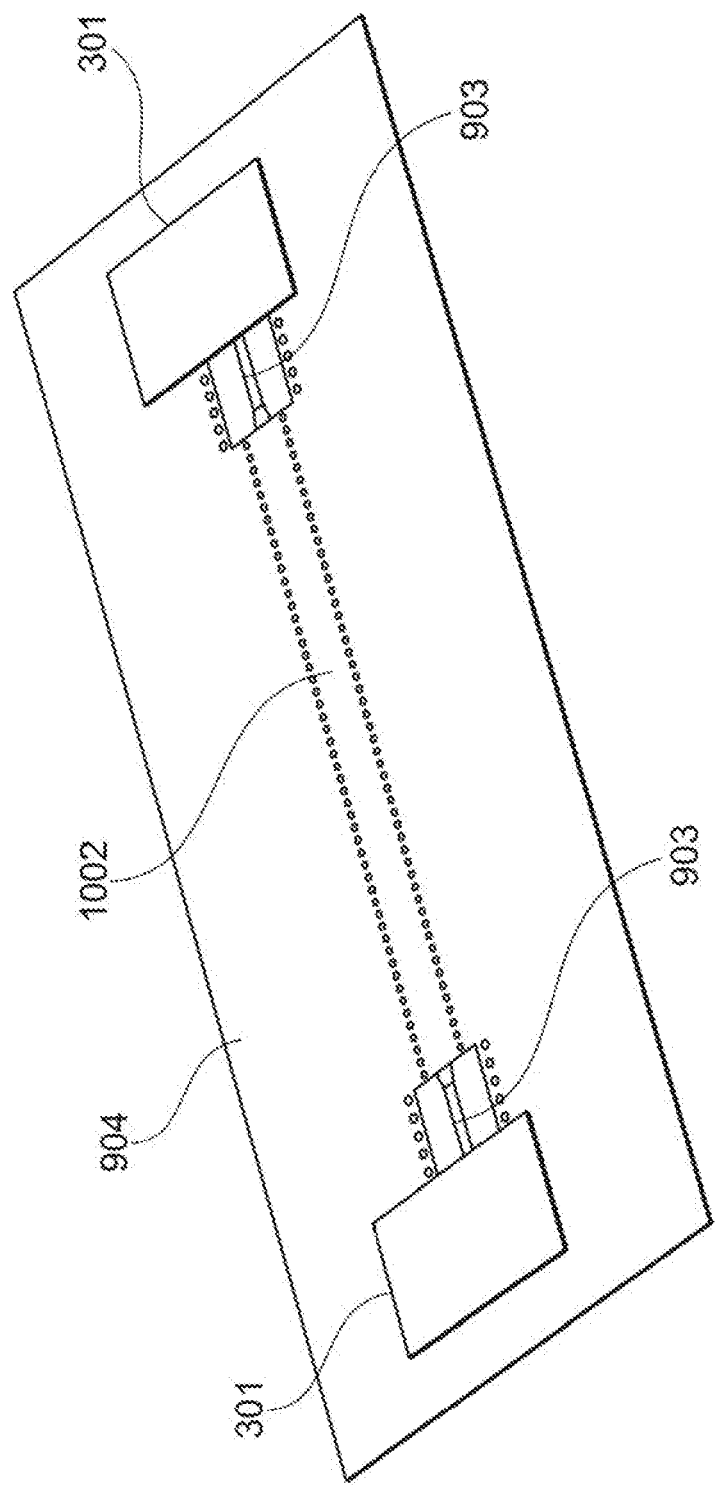
FIG. 12 shows a further high-frequency line arrangement.

Since a larger number of radar chips can be cascaded in this manner, it is possible that the output stage of the IX) signal may not provide sufficient output power in order to drive all the radar chips. A problem when distributing the LO signal to the high-frequency line 401 is that high-frequency lines have not insignificant path attenuation. Since the radar chips 301 are usually spatially separated from one another on the circuit board 904 by several centimeters (order of magnitude: 5-10 cm), the high-frequency lines 401 that guide the LO signal have to be at least this length. A typical microstrip line on a standard high-frequency substrate may have an attenuation of 0.5 dB/cm to 2 dB/cm. This is dependent mainly on the substrate and the frequency. Waveguides, in contrast, can be constructed so as to have significantly less path attenuation. For this reason, it is expedient to couple the signal into a waveguide after the LO-signal has been decoupled on the circuit board (904) by means of a microstrip line, in order that fewer losses are suffered over the distance to the adjacent chip (shown schematically in FIGS. 11 and 12).

Figure 6:
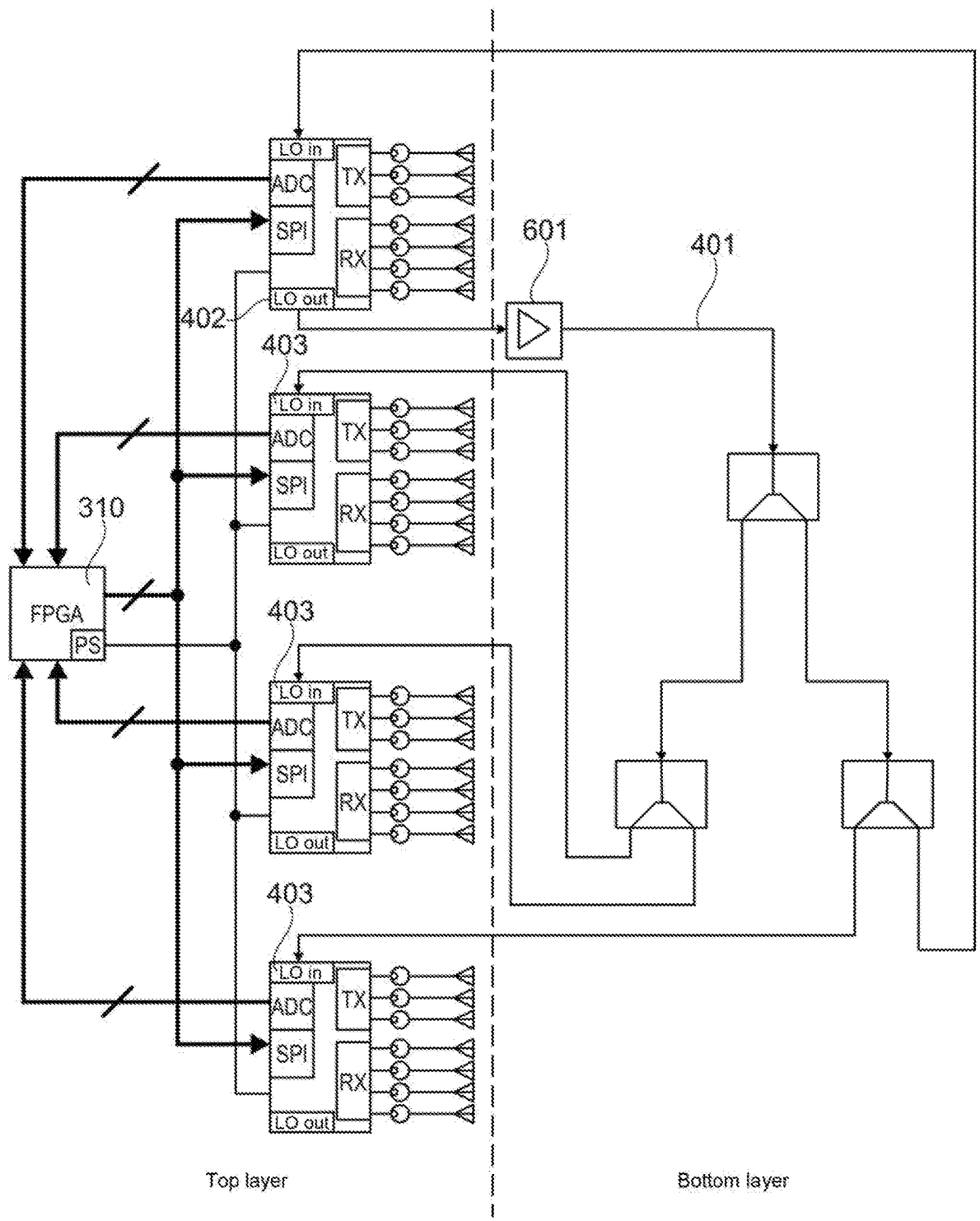
FIG. 6 shows the structure of a further radar fill level measurement device.
Figure 7:
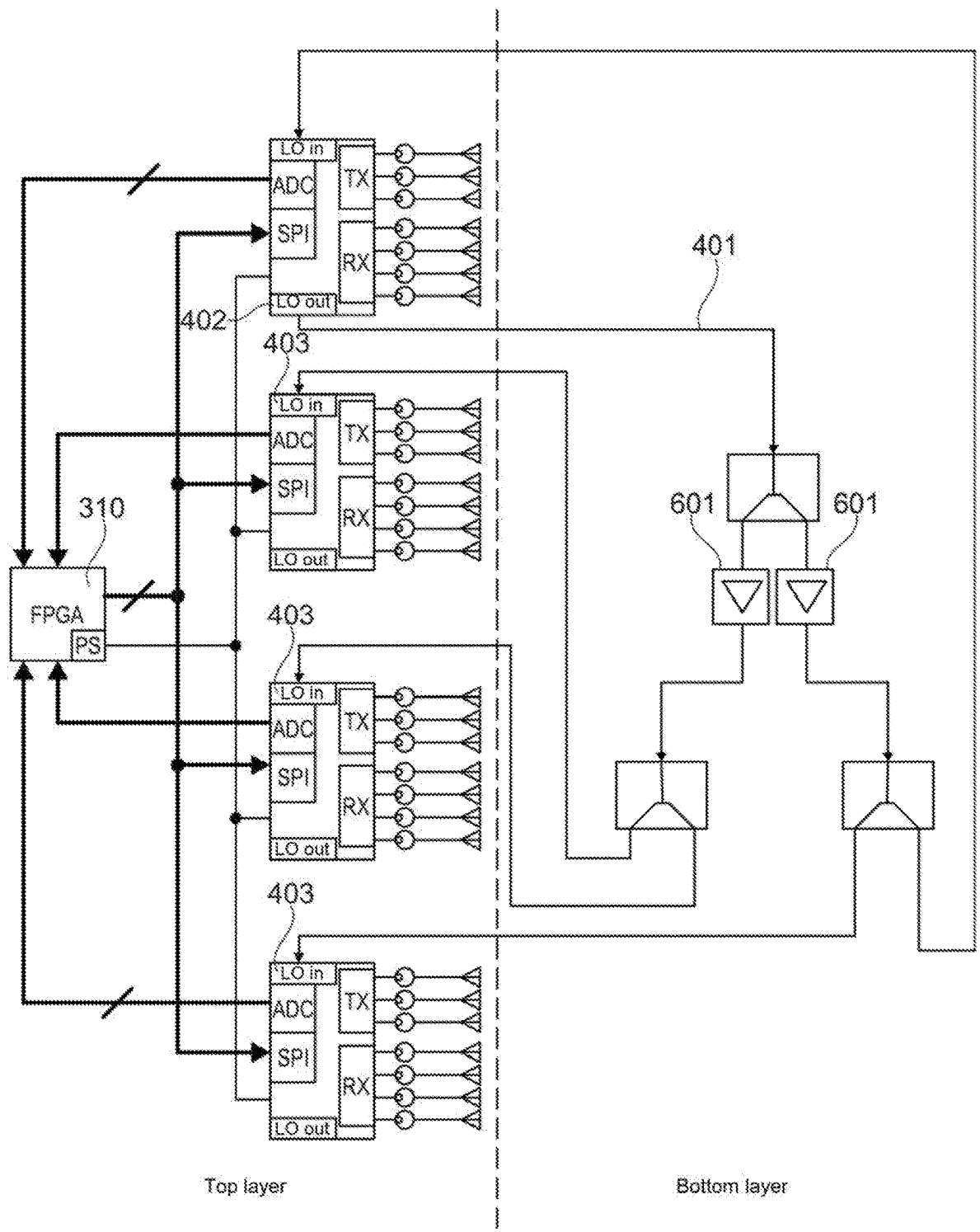
FIG. 7 shows the structure of a further radar fill level measurement device.

A further option is to use one or more external high-frequency amplifiers 601 in order to amplify the HF power of the LO signal on the high-frequency line 401 (FIGS. 6 and 7). These amplifiers advantageously have a low noise figure, since this has a direct impact on the system performance. Therefore, low noise amplifiers (LNAs) are proposed for this purpose. Said LNAs are active components comprising a separate power supply. Said LNAs are advantageously switched off between the radar frames and/or during transmission pauses in order to save energy and to prevent the device from overheating.

Furthermore, care should be taken that the LNAs are operated in the linear range thereof, which means that the input power of the high-frequency signal is not too great. If this is the case, signal distortion may occur. Owing to the technology, typical output powers of semiconductor components are between 8 dBm and 15 dBm at 80 GHz without substantial signal distortion occurring.

If a high-frequency signal having a power of 15 dBm is supplied to a high-frequency amplifier 601 having a gain of 20 dB, an output power of 35 dBm would result. However, since the high-frequency amplifier 601 would then no longer operate in the linear range thereof, this would lead to undesired signal distortion. Therefore, the LO signal should first be brought into a power range such that the high-frequency amplifier 601 can operate in the linear range thereof.

It is possible to parameterize, and thus attenuate, the LO output power of the radar chip 301. Likewise, a long high-frequency line can also attenuate the output power.

For example, the high-frequency amplifiers can also be used only once the LO signal has been divided using a high-frequency power divider and thus the power of said signal has been reduced. This is the case if a plurality of staves 301*b* are used, or if, depending on the radar chip 301, the LO signal has to be returned to the master 301*a* again.

A plurality of amplifiers can then be used, as can be seen in FIG. 7. Since an amplifier also has a finite signal transit time, the amplifiers are advantageously positioned such that substantially the same signal transit time is established on all the lines.

Since the LO signal is a high-frequency signal, waveguides, microstrip lines 903 and/or SIW (substrate integrated waveguide) lines 1002 (FIG. 10A) can advantageously be used. Power dividers 501 (e.g., Wilkinson dividers) and/or couplers 501 (e.g., rat-race couplers) can also be advantageously used for splitting the power.

Figure 5:
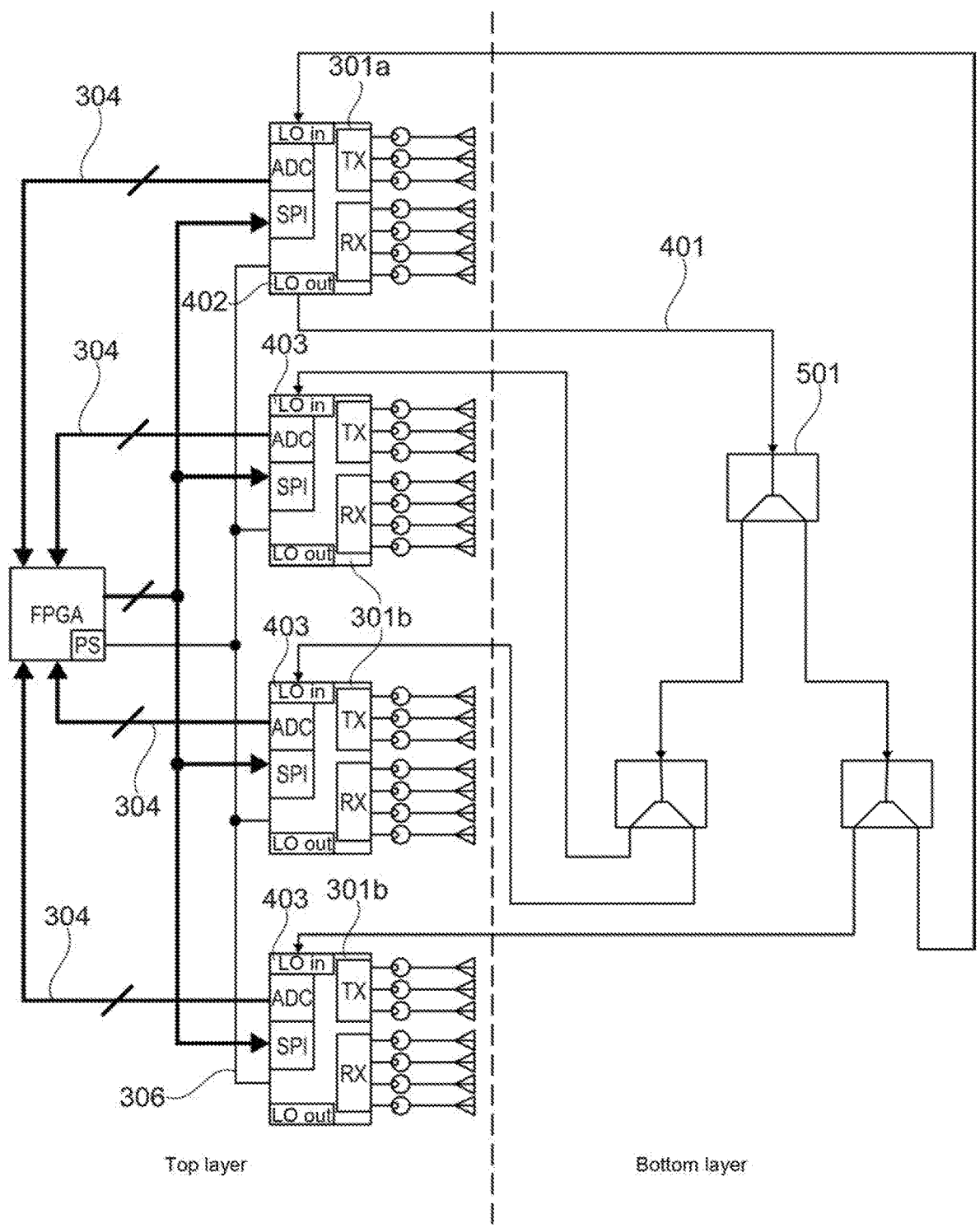
FIG. 5 shows the structure of a further radar fill level measurement device.
Figure 13A:
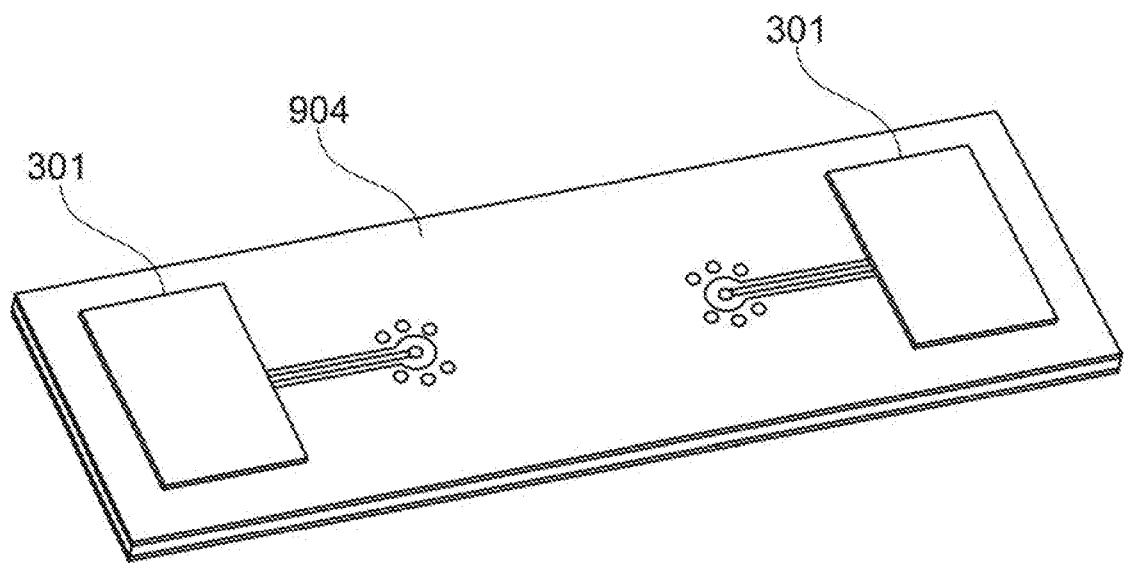
FIG. 13A is a plan view of a further high-frequency line arrangement.
Figure 13B:
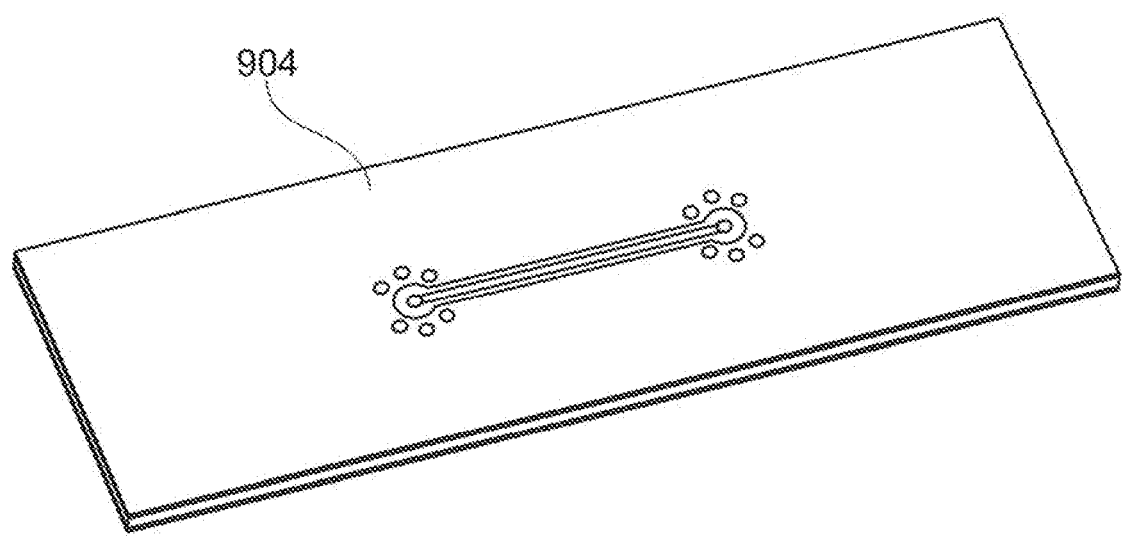
FIG. 13B shows the underside of the circuit board of the line arrangement of FIG. 13A.

The radar chips can advantageously be positioned on a side of the circuit board 904 and the LO signal is then split and distributed on the other side of the circuit board 904, as shown in FIGS. 5 to 7 and in FIGS. 13A and 13B. The reason for this is explained in the following.

The radar chips usually comprise nine or ten signal inputs and signal outputs, the frequency range of which is in the double-digit gigahertz range. In the case of cascading of the radar chips, in addition to the lines to the transmission and reception antennae, the LO signals also have to be routed from chip to chip. This plurality of signal lines means that intersections of signals are often unavoidable.

Figure 8:
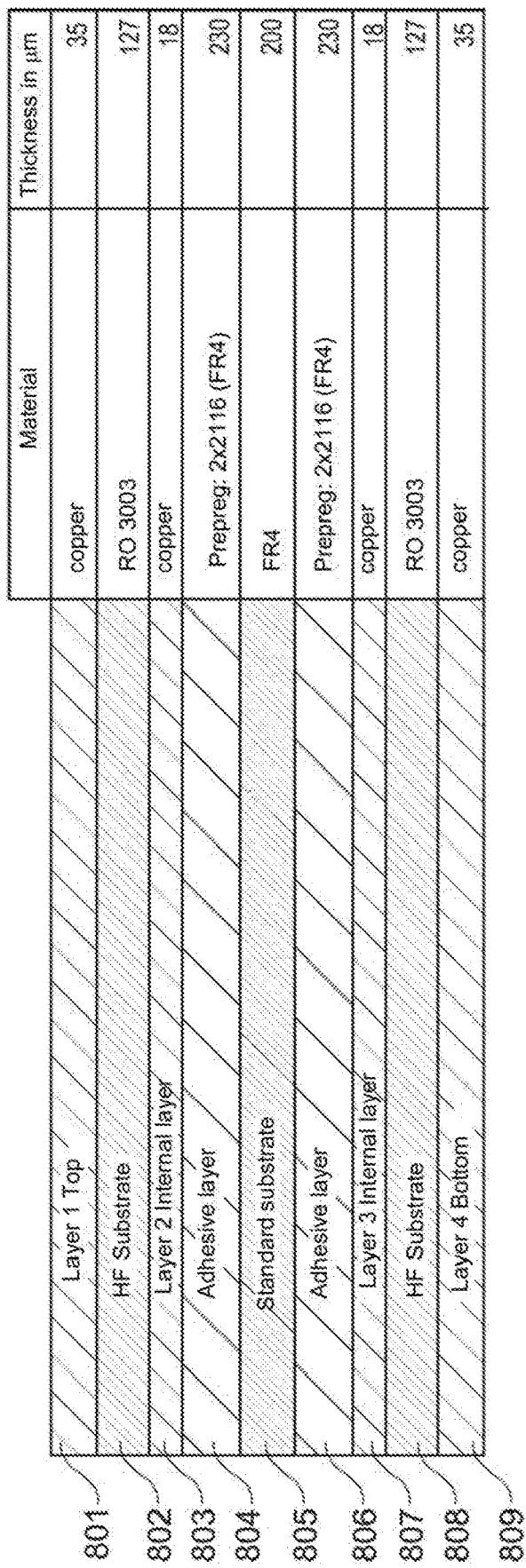
FIG. 8 shows a circuit board layer structure.

However, since it is not possible for signal lines to intersect on a circuit board 904, the signals are usually conducted by vias into other internal circuit board planes (internal layers) 803, 807 and are conveyed past one another there. A typical circuit board layer structure can be seen in FIG. 8, a plurality of substrates being adhesively bonded together using an adhesive film 804, 806. However, internal layers of circuit boards 904 are usually standard substrate materials 804, 805, 806 and are not suitable for high-frequency signals. Specifically, for reasons of cost and stability, usually just one or both of the outermost substrate layers 802, 808 of a circuit board 904 are constructed from substrate material that is Specially optimized for high-frequency technology (for example Rogers RO3003). High-frequency substrates are generally flexible and are often very thin in the case of high frequencies, as shown by 127 µm in FIG. 8. The outer layers 801, 809 are metallized layers.

Figure 9A:
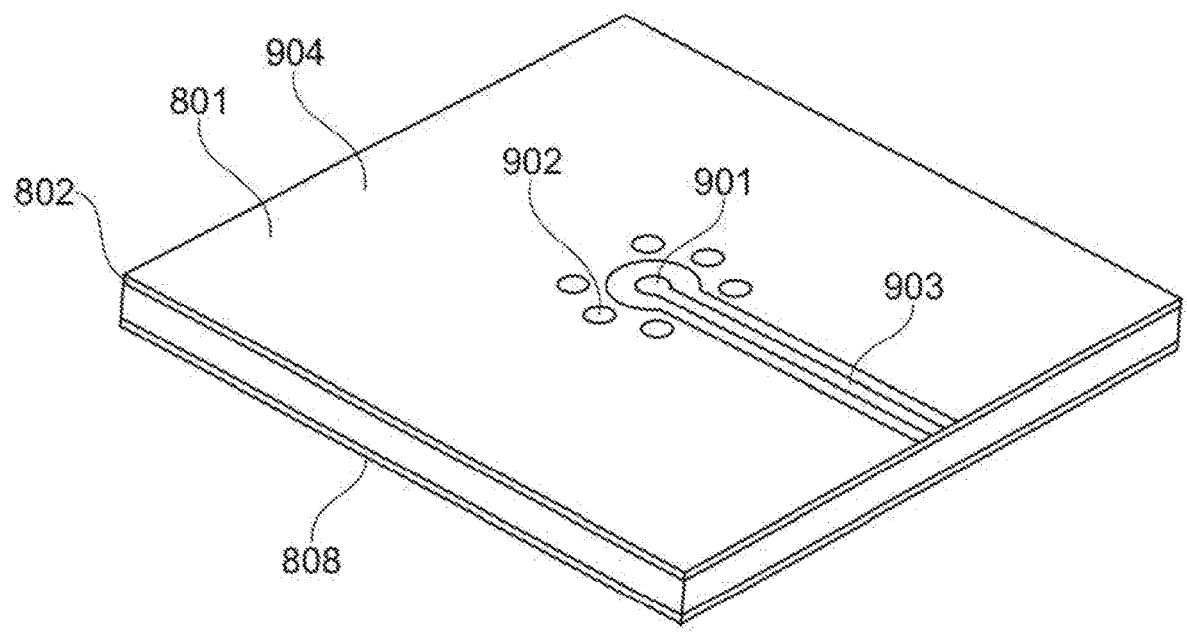
FIG. 9A shows a via arrangement of a radar fill level measurement device.
Figure 9B:
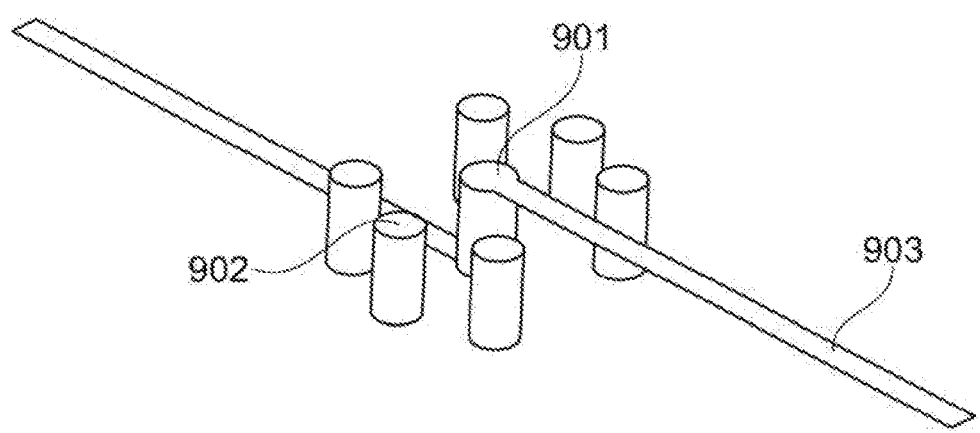
FIG. 9B shows the metallized elements of the via arrangement of FIG. 9A.

For these reasons, it is proposed to guide the LO signal from the circuit board plane on the chip side to the rear face using special line structures and via arrangements and to split, optionally amplify, and distribute said signal at said rear face, and for it to re-emerge on the circuit board plane on the chip side. Special line structures and via arrangements of this kind can be seen in FIGS. 9A and 9B (FIG. 9B shows the line and vias without the substrate materials and copper surfaces). In this case, further secondary vias 902 are positioned around the main via 901 at a constant radius and thus form a type of coaxial circuit board feedthrough. The via diameter and the spacing from the main via substantially determine the impedance of the feedthrough and must be adjusted to the frequency range used, for example, 40 GHz.

An alternative option for routing the LO signals without the lines intersecting is to couple the signal into a waveguide or a coaxial cable and to construct the waveguide or coaxial cable such that the lines are guided past one another. A transition from a microstrip line to a waveguide 1101 can be used for coupling into a waveguide, for example.

Figure 10A:
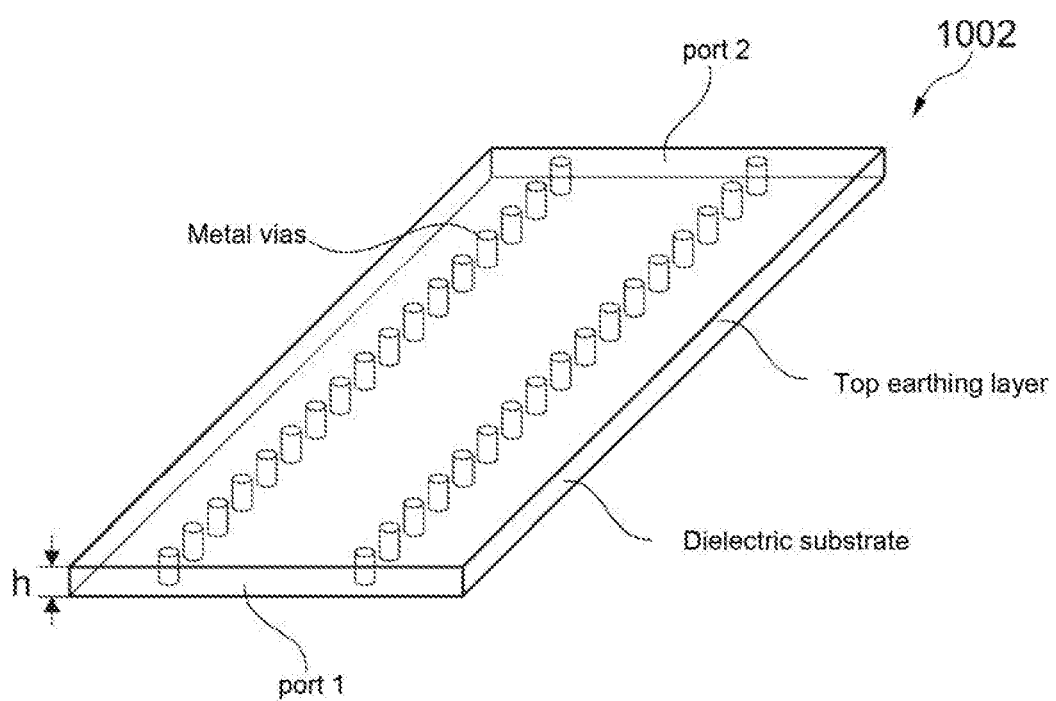
FIG. 10A shows a detail of a high-frequency line arrangement.
Figure 10B:
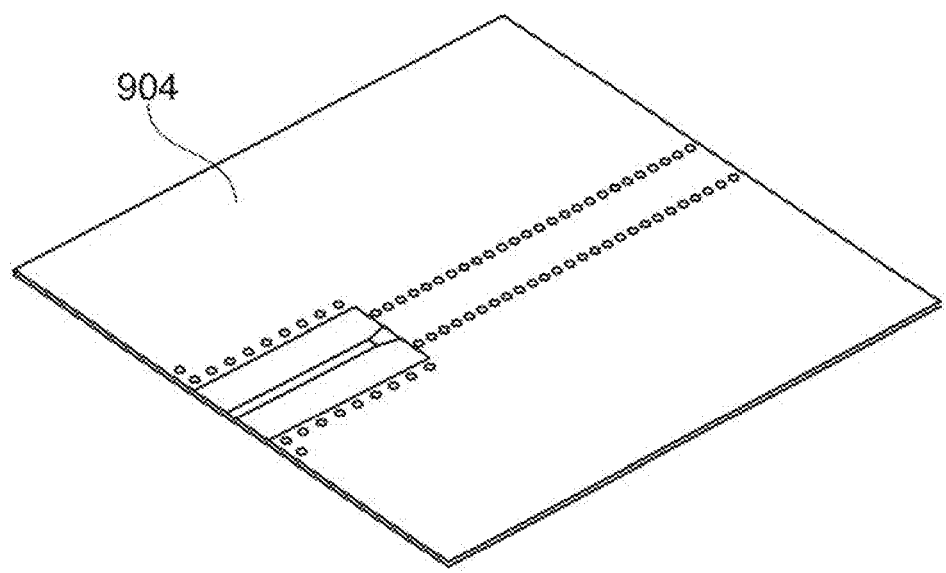
FIG. 10B shows a detail of a further high-frequency line arrangement.
Figure 10C:
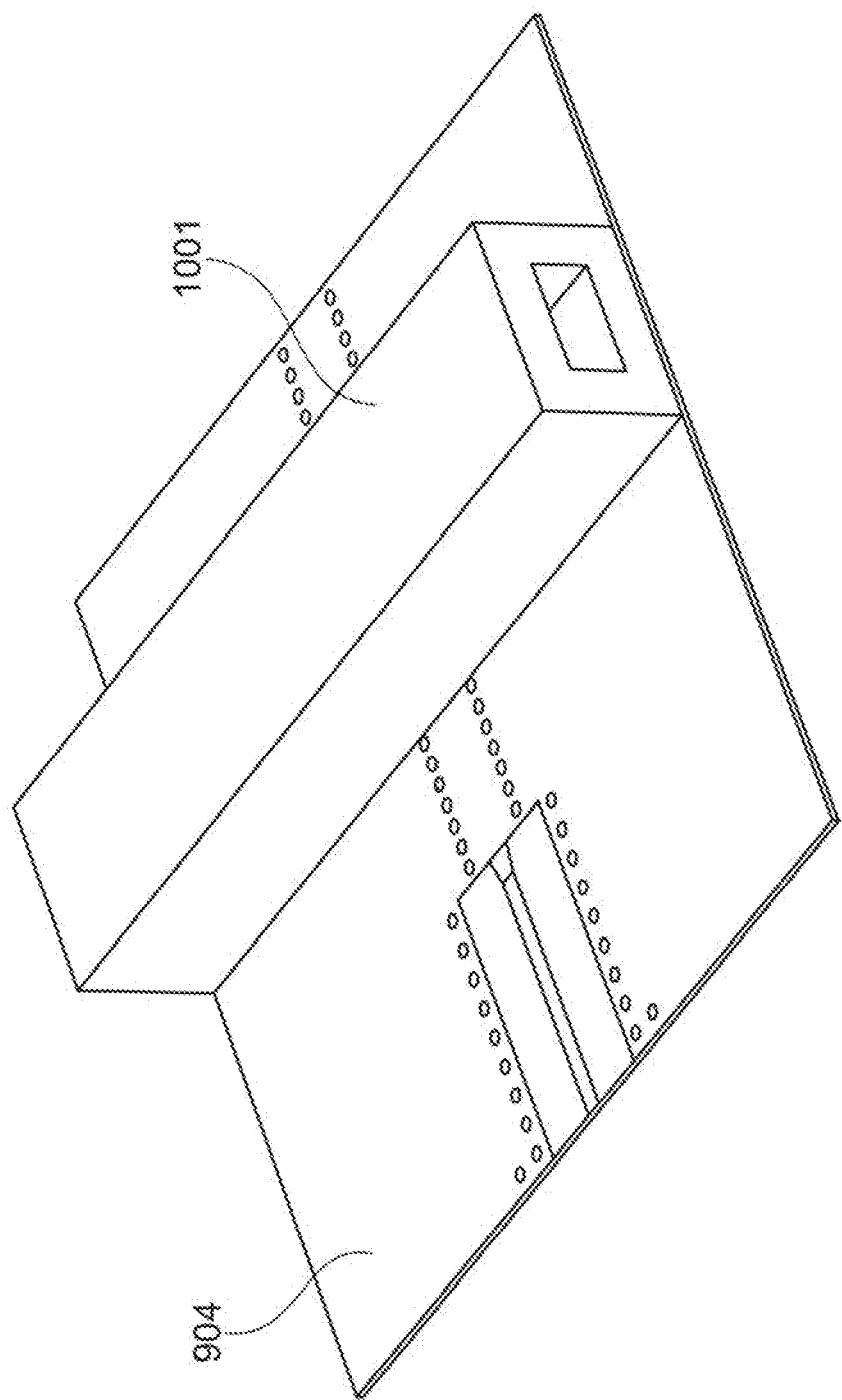
FIG. 10C shows a detail of a further high-frequency line arrangement.

A line type that is also expedient is the substrate integrated waveguide (SIW) (FIG. 10A). Said line type is advantageously used if a waveguide 1001 is for example positioned directly on a circuit board 904 on which an LO/HF signal has to be routed through below the waveguide using a microstrip line. Since the waveguide usually consists of a metal, it would short-circuit the microstrip line, making signal transmission impossible. In this case, the SIW is advantageous since it comprises a pure metal surface on the top of the circuit board, and it is irrelevant whether a waveguide is positioned thereover (see FIG. 10C). FIG. 10B shows a transition from microstrip line technology to SIW.

Subsequently, the signal has to be coupled back into a microstrip line on the circuit board (904) order to be able to be routed into the radar chip.

Radar fill level measurement devices are distinguished by robust antenna assemblies which continue to function in harsh process conditions, such as high and low pressures, high and low temperatures, dirt, dust, humidity, mist, etc. In addition, the antennae must also protect the electronics from the above influences, and must additionally be designed so as to also comply with safety-critical aspects such as explosion protection.

These properties should therefore also exist in a number of topology-detecting radar fill level measurement devices. Unlike in the case of radar devices used elsewhere, for which requirements of this kind are less stringent, waveguides and horn radiators are often used in process measuring technology.

It is advantageous, in systems for digital beam forming, for one or more antenna elements to have a spacing of ≤λ/2, λ denoting the wavelength of the transmission signal. Special waveguide couplings (302) can be used for cases of this kind in order to couple the signal from a circuit board into a (horn) antenna (303).

A further challenge in the case of the topology-detecting radar fill level measurement devices comprising cascaded radar chips is that the above-described antennae may be arranged only in specific patterns. An advantageous pattern would be a T-shaped or L-shaped arrangement of the antenna elements. In order to prevent long line lengths in the case of the high-frequency signals, it is proposed to position the radar chips on the top and bottom of the circuit board in order that the line lengths between the radar chip and the waveguide coupling are approximately the same for all the HF signals.

A basic concept of the claimed invention consistent with the described embodiments can be considered to be that of providing a radar fill level measurement device 101 that detects the topology of the filling material surface and that consists of a plurality of integrated radar chips 301 or comprises said chips at least in part, the radar chips 301 being synchronized to one another by means of a high-frequency signal (local oscillator signal) that is generated by a synchronization circuit 402 of one of the radar chips 301a and is guided, on a high-frequency line 401, to a synchronization circuit 403 of the second radar chip 301b, and one or more high-frequency amplifiers 601 amplifying the local oscillator signal of the radar chip 301a.

For the sake of completeness, it should be noted that "comprising" and "having" do not exclude the possibility of other elements or steps, and the indefinite articles "an" or "a" do not exclude the possibility of a plurality. It should also be pointed out that features or steps described with reference to one of the above embodiments may also be used in combination with other features or steps of other above-described embodiments. Reference numerals in the claims should not be treated as limiting.

We claim:

1. A radar fill level measurement device for fill level measurement or for detecting a topology of a filling material surface in a container, comprising:
    a first radar chip and a second radar chip,
        wherein the first radar chip, as a master chip, comprises a first synchronization circuit configured to generate a high-frequency synchronization signal, and
        wherein the second radar chip, as a slave chip, comprises a second synchronization circuit configured to receive the high-frequency synchronization signal;
    a high-frequency line arrangement configured to transfer the high-frequency synchronization signal from the first synchronization circuit to the second synchronization circuit for synchronizing the two radar chips; and
    a high-frequency amplifier arranged in the high-frequency line arrangement and configured to amplify the high-frequency synchronization signal.

2. The radar fill level measurement device according to claim 1,
    wherein the high-frequency synchronization signal is a signal that is divided by a whole number factor compared to a transmission signal.

3. The radar fill level measurement device according to claim 1,
    wherein the high-frequency amplifier has a frequency of over 30 GHz.

4. The radar fill level measurement device according to claim 1,
    wherein a first analogue-to-digital converter is integrated on the first radar chip and a second analogue-to-digital converter is integrated on the second radar chip.

5. The radar fill level measurement device according to claim 1,
    wherein the high-frequency line arrangement is split by means of a high-frequency power divider, and the high-frequency amplifier is arranged downstream of the high-frequency power divider.

6. The radar fill level measurement device according to claim 1, wherein the high-frequency amplifier is a low noise amplifier (LNA) comprising a separate power supply.

7. The radar fill level measurement device according to claim 6,
further comprising a field programmable gate array (FPGA) configured to switch off the low noise amplifier during a transmission pause of the radar fill level measurement device, wherein during the transmission pause, signal processing and calculation of a fill level or of a topology of a surface of a medium in the container is carried out by means of the FPGA.

8. The radar fill level measurement device according to claim 1,
wherein the high-frequency line arrangement comprises a plurality of low noise high-frequency amplifiers comprising separate power supplies.

9. The radar fill level measurement device according to claim 1,
wherein the high-frequency line arrangement comprises a first conductive track on a circuit board, a second conductive track on the circuit board, and a waveguide arranged therebetween.

10. The radar fill level measurement device according to claim 1, the device being configured to detect a topology of a medium in a container.

11. The radar fill level measurement device according to claim 1,
wherein the first radar chip and the second radar chip each comprise one or more transmission channels configured to emit one transmission signal in each case, and one or more reception channels configured to receive transmission signals reflected from a filling material surface in said each case.

12. The radar fill level measurement device according to claim 1, the device being configured as an FMCW fill level measurement device.

\* \* \* \* \*